(12) United States Patent
Tseng

(10) Patent No.: US 6,180,537 B1
(45) Date of Patent: Jan. 30, 2001

(54) METHOD OF FABRICATING DIELECTRIC LAYER IN ALIGNMENT MARKER AREA

(75) Inventor: Chin-Hung Tseng, Hsinchu (TW)

(73) Assignee: United Silicon Incorporated, Hsinchu (TW)

(*) Notice: Under 35 U.S.C. 154(b), the term of this patent shall be extended for 0 days.

(21) Appl. No.: 09/250,620

(22) Filed: Feb. 16, 1999

(30) Foreign Application Priority Data

Dec. 14, 1998 (TW) .................................................. 87120715

(51) Int. Cl.⁷ .................................................. H01L 21/469
(52) U.S. Cl. .......................................... 438/758; 438/758
(58) Field of Search ..................................... 438/401, 462, 438/633, 638, 639, 669, 692, 720, 723, 737, 743, 763, 778, 975, 758, 424

(56) References Cited

U.S. PATENT DOCUMENTS

| 5,401,691 | * | 3/1995 | Caldwell | 437/228 |
| 5,786,260 | * | 7/1998 | Jang et al. | 438/401 |
| 5,889,335 | * | 3/1999 | Kuroi et al. | 257/797 |
| 5,958,800 | * | 9/1999 | Yu et al. | 438/720 |
| 6,043,133 | * | 3/2000 | Jang et al. | 438/401 |

* cited by examiner

Primary Examiner—David Nelms
Assistant Examiner—David Nhu
(74) Attorney, Agent, or Firm—Jiawei Huang; J C Patents

(57) ABSTRACT

A method for fabricating a dielectric layer in an alignment marker area is provided. A wafer having an alignment marker area is formed. The alignment marker area has large trenches and small trenches formed in the wafer. A dielectric layer is formed over the wafer. Portions of the dielectric layer directly above the large trenches in the alignment marker area are removed to form trench structures.

16 Claims, 5 Drawing Sheets

METHOD OF FABRICATING DIELECTRIC LAYER IN ALIGNMENT MARKER AREA

CROSS-REFERENCE TO RELATED APPLICATION

This application claims the priority benefit of Taiwan application Ser. No. 87120715, filed Dec. 14, 1998, the full disclosure of which is incorporated herein by reference.

BACKGROUND OF THE INVENTION

1. Field of the Invention

The present invention relates to a semiconductor fabricating method. More particularly, the present invention relates to a method of forming an alignment marker area.

2. Description of the Related Art

The purpose of a photolithographic process is to transfer a predetermined pattern onto a wafer. In order to transfer the predetermined pattern onto the wafer precisely, it is necessary to align the wafer before a photoresist exposure step takes place. In a wafer alignment procedure, trenches are first formed in specific areas of the wafer. The trenches are used to define an alignment marker area. The wafer alignment is obtained by detecting the reflection lights from the trenches in the alignment marker area.

FIGS. 1A through 1B are schematic, cross-sectional views of a conventional method of forming a dielectric layer in an alignment marker area.

In FIG. 1A, a wafer 100 having an alignment marker area 102 and a device area 104 is provided. The alignment marker area 102 includes trenches 102a and 102b formed in the wafer 100. The depth of the trenches 102a and 102b is about 1200 Å. A device layer 106, which includes a variety devices (not shown), such as a silicon substrate, a source/drain region, a gate, etc., is formed on the wafer 100 in the device area 104.

In FIG. 1B, a metallic interconnection fabricating process is performed. A dielectric layer 108 is formed over the wafer 100. Commonly, the dielectric layer 108 is sufficiently transparent in a photolithographic process. The transparency of the dielectric layer 108 is advantageous to the alignment detection for the wafer 100. However, when the dielectric layer 108 is too thick, often thicker than 40000 Å, it is difficult to detect trenches 102a and 102b in the alignment marker area 102.

SUMMARY OF THE INVENTION

A method of fabricating a dielectric layer in an alignment marker area. A wafer having an alignment marker area is provided. The alignment marker area has a plurality of large trenches and a plurality of small trenches. A dielectric layer is formed over the wafer. Portions of the dielectric layer in the alignment marker area are removed to form a plurality of trench structures. The trench structures in the dielectric layer are directly above the large trenches. A distance between the sidewalls of the trench structures and the sidewalls of the large trenches is greater than 0.5 mm.

The invention can also be used to form an alignment marker area on an edge of a wafer. A drainage structure, with an opening edge along the edge of the wafer, is also formed in the dielectric layer when the trench structures are formed. Thus, the slurry used in a chemical mechanical polishing step can drain off the edge of the wafer because of the drainage structure.

The invention can further provide a method for controlling a thickness of multiple dielectric layers in an alignment marker area. A wafer having an alignment marker area and a device area is provided. The alignment marker area comprises a plurality of large trenches and a plurality of small trenches. A dielectric layer over the wafer. A plurality of trench structures and a plurality of contact openings are formed in the dielectric layer. The trench structures are located above the large trenches. The contact openings are formed in the dielectric layer in the device area. A first metallic layer is formed on the dielectric layer to fill the contact openings. A portion of the first metallic layer and a portion of the dielectric layer are removed to form a plurality of metallic plugs in the contact openings. A second metallic layer is formed on the metallic plugs. An inter-metal dielectric layer is formed on the dielectric layer and the second metallic layer. A portion of the inter-metal dielectric layer is removed to make the inter-metal dielectric layer in the alignment marker area thinner than the inter-metal dielectric layer in the device area.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
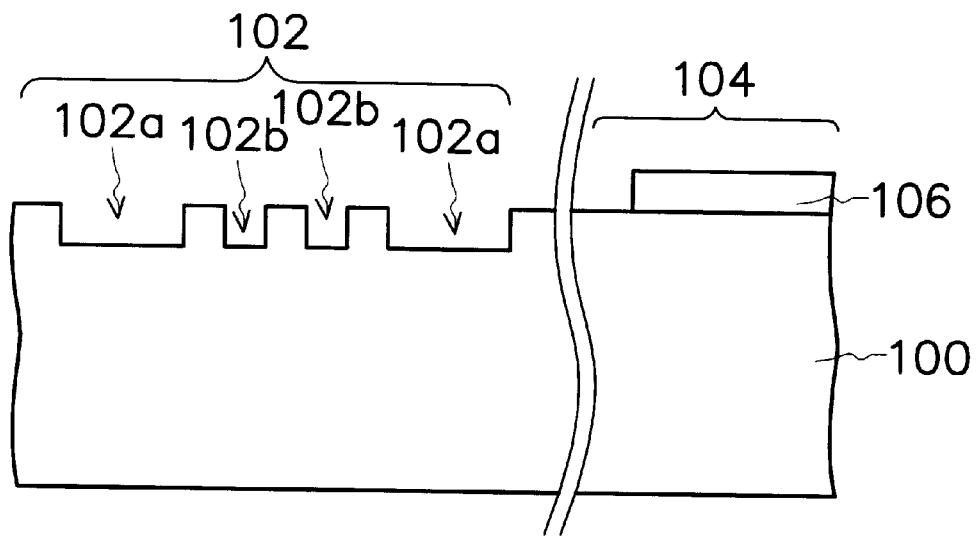
FIGS. 1A through 1B are schematic, cross-sectional views of a conventional method of forming a dielectric layer in an alignment marker area.
Figure 1B:
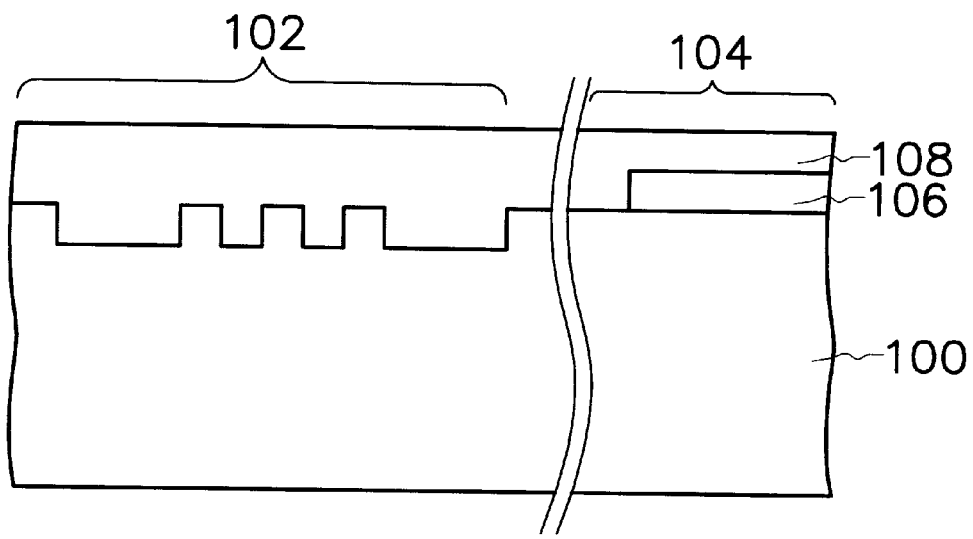

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2F are schematic, cross-sectional views showing a method of fabricating a dielectric layer in an alignment marker area according to one preferred embodiment of the invention.

Figure 2A:
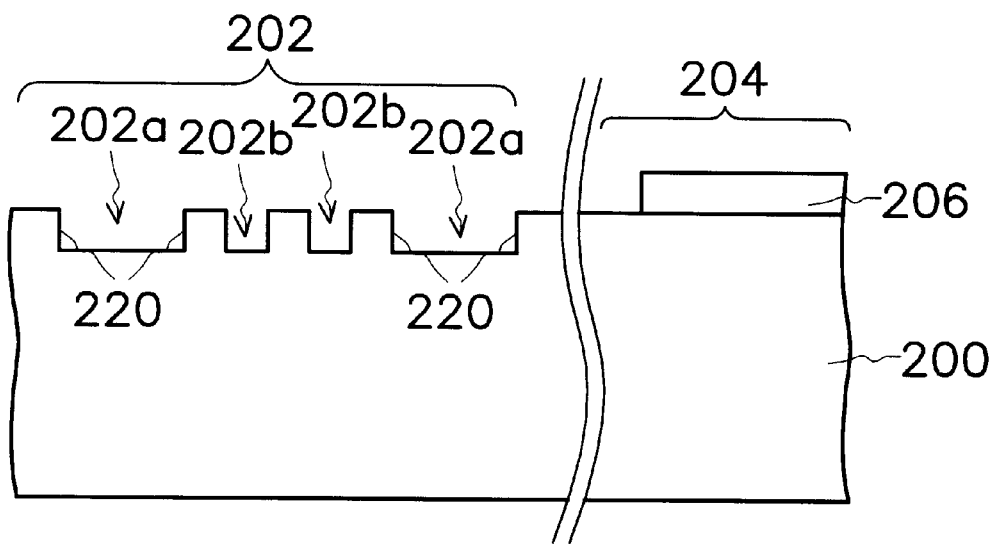
FIGS. 2A through 2F are schematic, cross-sectional views showing a method of fabricating a dielectric layer in an alignment marker area according to one preferred embodiment of the invention.

In FIG. 2A, a wafer 200 having an alignment marker area 202 and a device area 204 is provided. A device layer 206 including a variety of devices (not shown), such as a silicon substrate, a source/drain region, a gate, etc., is formed on the wafer 200 in the device region 204. The alignment marker area 202 includes large trenches 202a and small trenches 202b on the wafer 200. The large trenches 202a and the small trenches 202b together form a step-height surface on the wafer 200 in the alignment marker area 202. The step-height surface in the alignment marker area 202 is used to reflect different reflection lights, which is advantageous to the alignment detection. The sizes of the trenches 202a and 202b are determined according to the total thickness of multiple dielectric layers (shown in FIG. 2F) formed thereon. Typically, the depth of the trenches 202a and 202b preferably is about 5000 angstroms to 15000 angstroms.

Figure 2B:
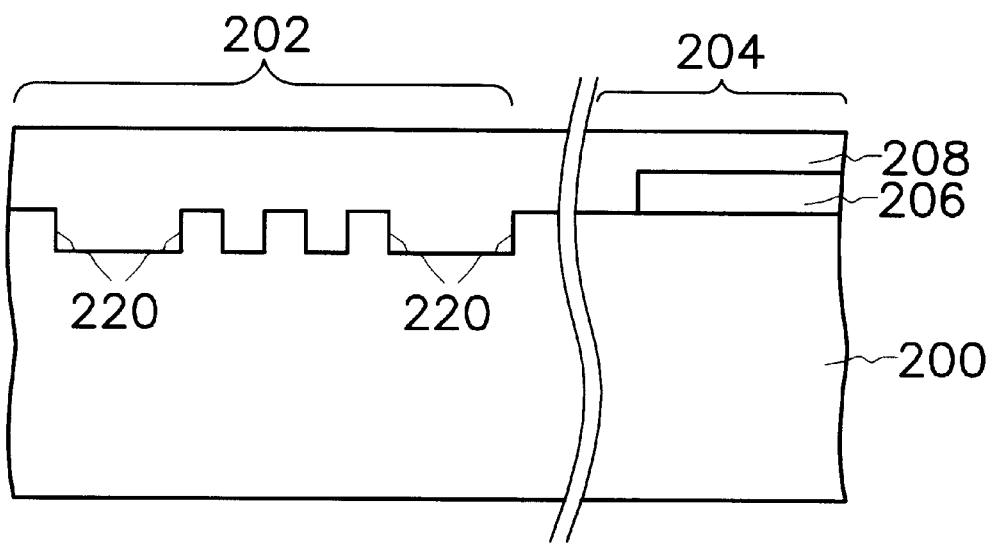

In FIG. 2B, a planarized dielectric layer 208 is formed over the wafer 200. The planarized dielectric layer 208 can be formed by the following exemplary steps. A dielectric layer (not shown), such as an inter-layer dielectric (ILD), is formed over the wafer 200. The dielectric layer can be formed by, for example, chemical vapor deposition. A planarization process, such as a chemical mechanical polishing process, is performed. The dielectric layer is planarized to form the planarized dielectric layer 208.

Figure 2C:
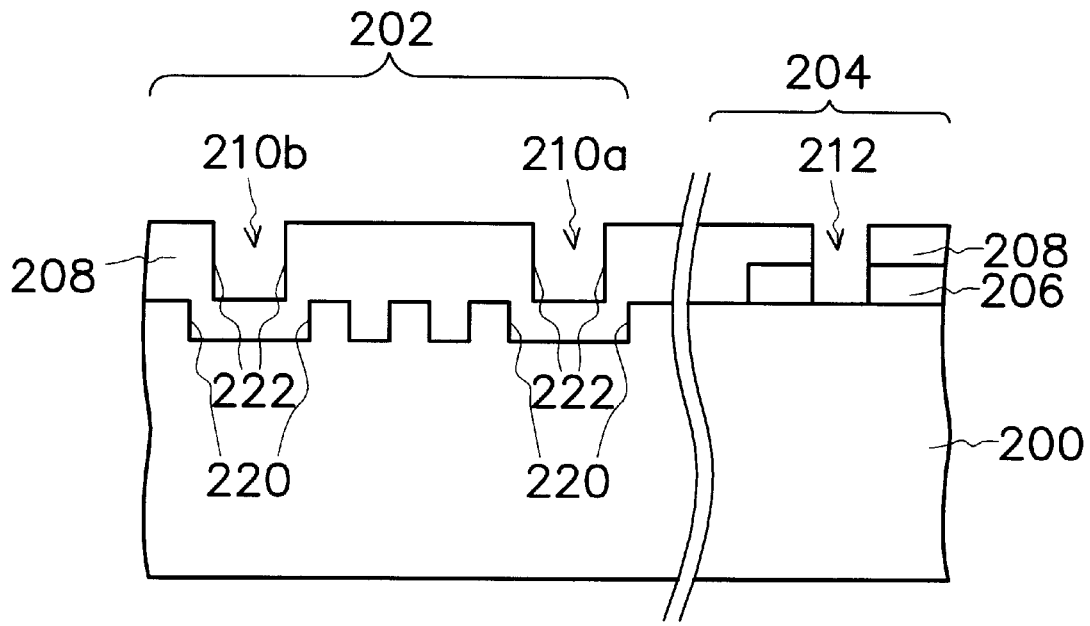

In FIG. 2C, portions of the dielectric layer 208, which are directly above the large trenches 202a (FIG. 2A) in the alignment marker area 202, are removed to form trench structures 210a and 210b. A portion of the dielectric layer 208 in the device region 204 is removed to form a contact opening 212. The dielectric layer 208 can be removed by, for example, anisotropic etching. There can be several contact openings formed in the device region 204, although in this preferred embodiment one contact opening 212 is taken as an example.

After the trench structures 210a and 210b are formed, the dielectric layer 208 directly above the small trenches 202b rises above the dielectric layer 208 directly above the large trenches 202a. The sidewalls 222 of the trench structures 210a and 210b cannot be close to the sidewalls 220 of the trenches 202a, in order to prevent the alignment marker area 202 from being damaged. Additionally, the trench structures 210a and 210b are large. Thus, the following chemical mechanical polishing step may cause dishing in the trench structures 210a and 210b. Once the dishing occurs, it is easy to damage the alignment marker area 202 if the trenches 210a and 210b and the trenches 202a are close to each other. Therefore, a distance between the sidewalls 222 of trench structure 210a and 210b and the sidewalls 220 of the trenches 202a preferably is greater than 0.5 mm.

The step of removing the dielectric layer 208 to form the trench structures 210a and 210b and the step of removing the dielectric layer 208 to form the contact opening 212 can be performed in the same step, such as an etching step. In this manner, it is not necessary to increase the amount of masks, the fabrication cost, and the fabricating time.

Figure 2D:
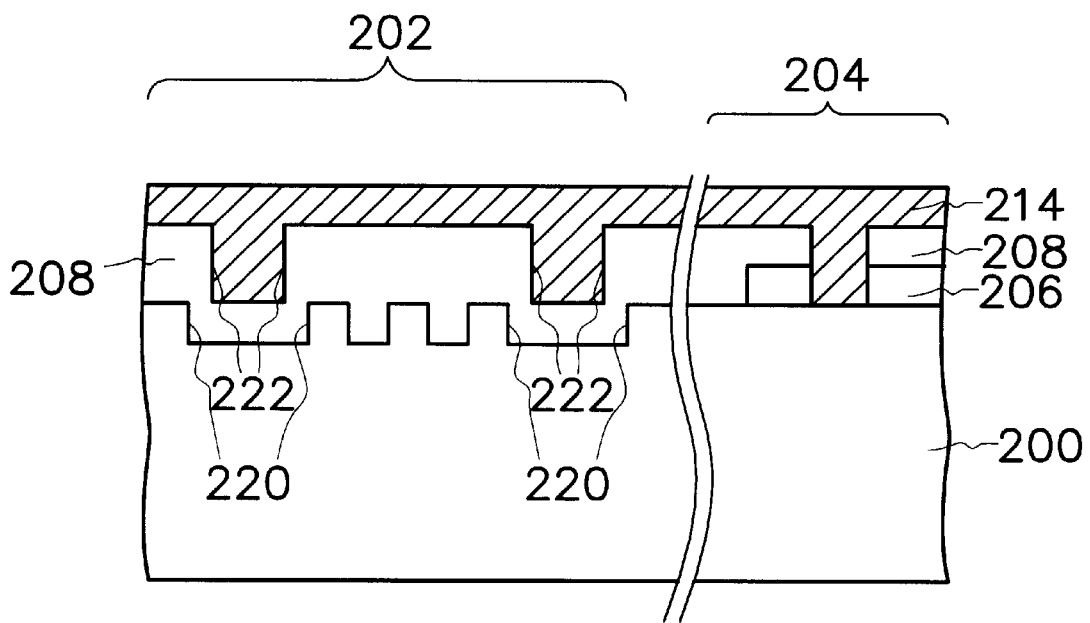

In FIG. 2D, a metallic layer 214 is formed over the wafer 200. The metallic layer 214 can be formed by, for example, chemical vapor deposition. The material of the metallic layer 214 can be tungsten, for example.

Figure 2E:
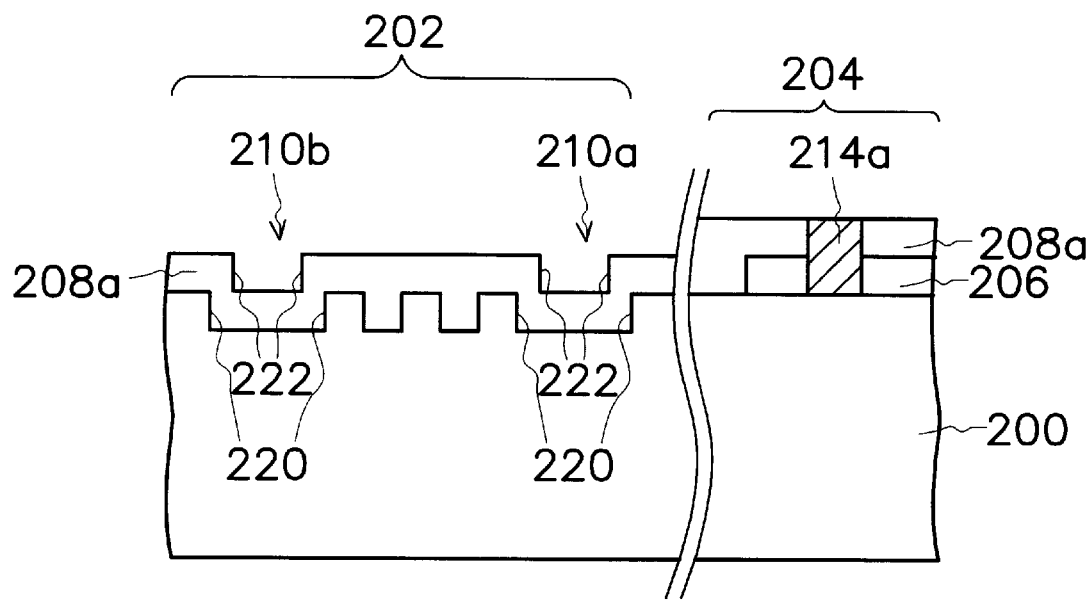

In FIG. 2E, a chemical mechanical polishing step is performed. A portion of the metallic layer 214 and a portion of the dielectric layer 208 are removed. A planarized dielectric layer 208a and a metallic plug 214a are formed. The refection from the metallic layer 214 (shown in FIG. 2D) causes a misalignment for the wafer 200. Thus, in order to prevent reflection from metallic layer 214, the metallic layer 214 in the alignment marker are 202 must be completely removed. Because the trench structures 210a and 210b are formed in the dielectric layer 208 in the alignment marker area 202, the polishing rate of the metallic layer 214 and the polishing rate of the dielectric layer 208 in the alignment mask area 202 are higher than those in the device region 204. Therefore, the metallic layer 214 in the alignment marker area 202 can be completely removed when the metallic plug 214a is formed. The dielectric layer 208a in the alignment mark area 202 is thinner than the dielectric layer 208a in the device region 204. Furthermore, the sizes of the trench structures 210a and 210b affect the polishing rate. Therefore, controlling the sizes of the trenches 210a and 210b controls the polishing rate. The thickness of the planarized dielectric layer 208a in the alignment marker area 202 can be further controlled by a polishing rate during chemical mechanical polishing.

Figure 2F:
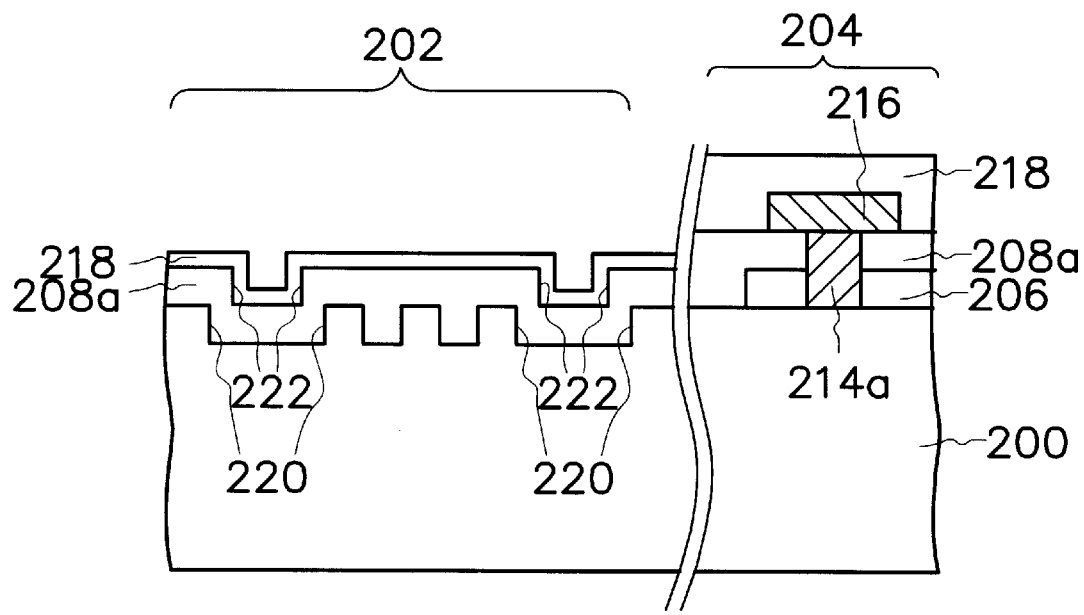

In FIG. 2F, a metallic layer 216, which serves as a metallic interconnection, is formed on the dielectric layer 208a in the device area 204. The metallic plug 214a and the metallic layer 216 are electrically coupled. An inter-metal dielectric layer 218 is formed to cover the dielectric layer 208 and the metallic layer 216. The metallic layer 216 can be formed by, for example, first depositing a conductive layer on the dielectric layer 208a, and then removing the conductive layer by a photolithographic process. The inter-metal dielectric layer 218 can be formed by, for example, first depositing an isolation layer to cover the metallic layer 216 and the dielectric layer 208a, and then planarizing the isolation layer by chemical mechanical polishing. Because the trench structures 210a and 210b are formed in the alignment marker area 202, the polishing rate of the inter-metal dielectric layer 218 in the alignment marker area 202 is higher than the polishing rate of the inter-metal dielectric layer 218 in the device area 204. Thus, the inter-metal dielectric layer 218 in the alignment marker area 202 can be more effectively removed than the inter-metal dielectric layer 218 in the device area 204. The thickness of the inter-metal dielectric layer 218 in the alignment marker area 202 is thinner than the inter-metal dielectric layer 218 in the device area 204. The material of the inter-metal dielectric layer 218 preferably is oxide. To the advantage of the subsequent alignment detection, the total thickness of multiple dielectric layers, such as the dielectric layer 208a and the inter-metal dielectric layer 218 in this preferred embodiment, preferably is lower than 4000 Å. The thickness is required in order to retain the transparency for detection during the wafer alignment step.

In this preferred embodiment, the dielectric layer 208a and the inter-metal dielectric layer 218 together form the multiple dielectric layers. However, the present invention is not limited to the formation of the exemplary double dielectric layers. There can be multiple dielectric layers formed over the wafer 200. The sizes of trenches 202a and 202b are predetermined according to the total thickness, which must be lower than 4000 Å, of the multiple dielectric layers. With the predetermined sizes trenches 202a and 202b, the polishing rate of the multiple dielectric layers is controlled. The thickness of the multiple dielectric layers thus can be controlled.

Figure 3:
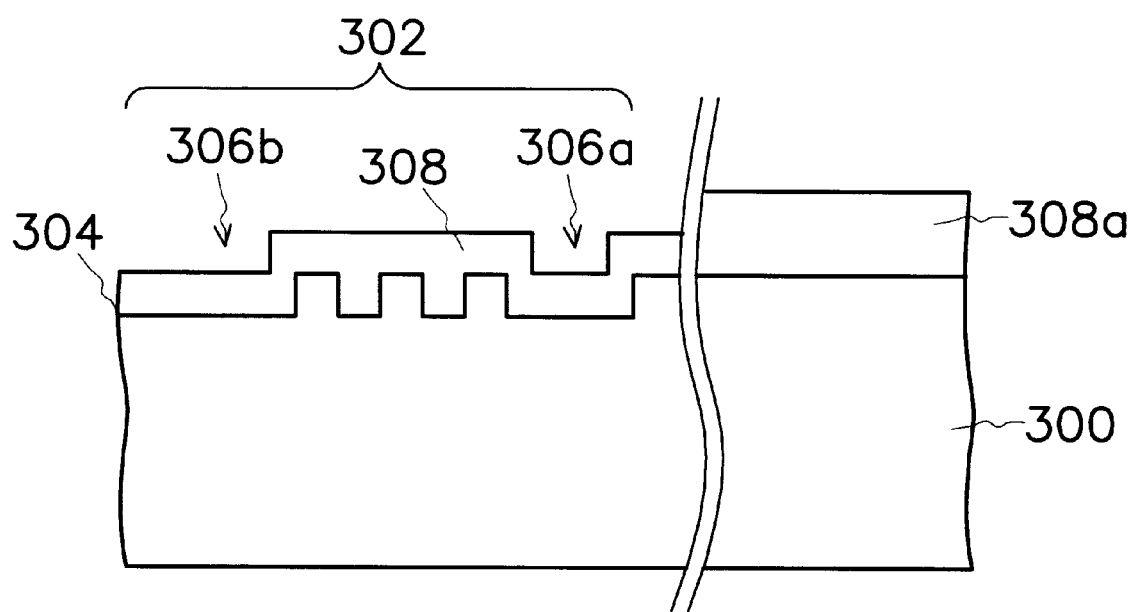
FIG. 3 is a schematic, cross-sectional view showing an alignment marker area formed on an edge of a wafer according to another preferred embodiment of the invention.

Reference is now made to FIG. 3, which describes an alignment marker area 302 formed on the edge 304 of the wafer 300. In this preferred embodiment, a trench structure 306a and a drainage structure 306b are formed in the alignment marker area by etching. If desired, there can be several trenches structure formed over the wafer 300. The drainage structure 306b is formed in order to remove the slurry used in the chemical mechanical polishing effectively. The drainage structure 306b has an open edge along the edge of the wafer 300, so that slurry used in the chemical mechanical polishing step to polish the dielectric layer 308 can drain off the edge of the wafer 300.

In summary, the invention has at least the following advantages:

1. The invention forms the trench structures 210a and 210b in the dielectric layer 208 above large trenches 202a in the alignment marker area 202. Thus, the polishing rate of the dielectric layer 208 in the alignment marker area 202 is higher than that in the device area 204. The remaining thickness of the dielectric layer 208 in the alignment marker area 202 can be effectively decreased after polishing.

2. The step of removing the dielectric layer 208 to form the trench structures 210a and 210b and the step of removing the dielectric layer 208 to form the contact opening 212 can be performed in the same step. In this manner, it is not necessary to increase the amount of masks, the fabrication cost, and the fabricating time.

3. The sizes of the trenches 202a and 202b affect the polishing rate of the multiple dielectric layers formed in the alignment marker area 202. Therefore, controlling the sizes of the trenches 202a and 202b controls the polishing rate of the dielectric layers. The total thickness of the dielectric layers in the alignment marker area 202 can be further controlled by the polishing rate during chemical mechanical polishing. The total thickness of the dielectric layers preferably is less than 40000 Å, which thickness is required in order to retain a high transparency of the dielectric layers. Thus, the alignment mark area 202 can be detected.

4. In the invention, a drainage structure 306b is formed when the trench 306a is formed. The drainage structure 306b is formed in order to remove effectively the slurry used in the chemical mechanical polishing. The drainage structure 306b has an open edge along the edge of the wafer 300, so that slurry used in the chemical mechanical polishing step to polish the dielectric layer 308 can drain off the edge of the wafer 300.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a dielectric layer in an alignment marker area, comprising the steps of:
   providing a wafer having an alignment marker area and a device area, wherein the alignment marker area has a plurality of large trenches and a plurality of small trenches;
   forming a dielectric layer directly on the wafer;
   removing portions of the dielectric layer above the large trenches to form a plurality of trench structures; and
   planarizing the dielectric layer, so that the dielectric layer in the alignment marker area is thinner than the dielectric layer in the device area.

2. The method of claim 1, wherein a depth of the trenches is about 5000 angstroms to 15000 angstroms.

3. The method of claim 1, wherein a distance between the sidewalls of the trench structures and the sidewalls of the large trenches is greater than 0.5 mm.

4. The method of claim 1, wherein the step of forming the trench structure comprises anisotropic etching.

5. A method for fabricating a dielectric layer in an alignment marker area, comprising the steps of:
   providing a wafer having an alignment marker area and a device area, wherein the alignment marker area has a plurality of trenches, and the device area has a plurality of contact openings;
   forming a dielectric layer over the wafer;
   removing portions of the dielectric layer to form a plurality of trench structures and drainage structures in the dielectric layer in the alignment marker area;
   forming a metallic layer in the contact openings for forming a plurality of metal plugs; and
   planarizing the dielectric layer using a chemical mechanical polishing process, so that the dielectric layer in the alignment marker area is thinner than the dielectric layer in the device area.

6. The method of claim 5, wherein a depth of the trenches is about 5000 angstroms to 15000 angstroms.

7. The method of claim 5, wherein the trench structures in the dielectric layer are above the trenches.

8. The method of claim 5, wherein a distance between the sidewalls of the opening structure and the sidewalls of the trenches is greater than 0.5 mm.

9. The method of claim 5, the drainage structures are along the edge of the wafer.

10. A method for controlling a thickness of multiple dielectric layers in an alignment marker area, comprising the steps of:
    providing a wafer having an alignment marker area and a device area, wherein the alignment marker area comprises a plurality of large trenches and a plurality of small trenches;
    forming a dielectric layer over the wafer;
    forming a plurality of trench structures and a plurality of contact openings in the dielectric layer, wherein the trench structures are located above the large trenches, and the contact openings are formed in the dielectric layer in the device area;
    forming a first metallic layer on the dielectric layer to fill the contact openings;
    removing a portion of the first metallic layer and a portion of the dielectric layer to form a plurality of metallic plugs in the contact openings, wherein the dielectric layer in the alignment marker area is thinner than the dielectric layer in the device area;
    forming a second metallic layer on the metallic plugs;
    forming an inter-metal dielectric layer on the dielectric layer and the second metallic layer; and
    removing a portion of the inter-metal dielectric layer to make the inter-metal dielectric layer in the alignment marker area thinner than the inter-metal dielectric layer in the device area.

11. The method of claim 10, wherein the step of forming the trench structures comprises anisotropic etching.

12. The method of claim 10, wherein the step of removing a portion of the first metallic layer and a portion of the dielectric layer comprising chemical mechanical polishing.

13. The method of claim 10, wherein a distance between the sidewalls of the opening structure and the sidewalls of the trenches is greater than 0.5 mm.

14. The method of claim 1, wherein the step of planarizing the dielectric layer comprising a chemical mechanical polishing.

15. The method of claim 14, wherein a polishing rate for the dielectric layer in the alignment marker area is greater than a polishing rate for the dielectric layer in the device area.

16. The method of claim 5, wherein a polishing rate for the dielectric layer in the alignment marker area is greater than a polishing rate for the dielectric layer in the device area.

* * * * *